(12) United States Patent
Minich

(10) Patent No.: US 7,384,289 B2
(45) Date of Patent: Jun. 10, 2008

(54) SURFACE-MOUNT CONNECTOR

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/284,154

(22) Filed: Nov. 21, 2005

(65) Prior Publication Data

US 2006/0172570 A1 Aug. 3, 2006

Related U.S. Application Data

(60) Provisional application No. 60/648,561, filed on Jan. 31, 2005.

(51) Int. Cl.
*H01R 4/60* (2006.01)

(52) U.S. Cl. ....................... 439/206; 439/190

(58) Field of Classification Search ................ 439/206, 439/190, 485, 205, 495
See application file for complete search history.

(56) References Cited

U.S. PATENT DOCUMENTS

| | | | |
|---|---|---|---|
| 3,286,220 A | 11/1966 | Marley et al. .............. | 439/680 |
| 3,538,486 A | 11/1970 | Shlesinger, Jr. ............. | 439/268 |
| 3,669,054 A | 6/1972 | Desso et al. ................. | 113/119 |
| 3,692,994 A * | 9/1972 | Hirschman et al. ......... | 362/263 |
| 3,748,633 A | 7/1973 | Lundergan .................. | 339/217 |
| 3,871,015 A | 3/1975 | Lin et al. ..................... | 357/67 |
| 4,076,362 A | 2/1978 | Ichimura .................... | 339/75 |
| 4,159,861 A | 7/1979 | Anhalt ........................ | 339/75 |
| 4,217,024 A | 8/1980 | Aldridge et al. ............ | 339/275 |
| 4,260,212 A | 4/1981 | Ritchie et al. ................ | 339/97 |
| 4,288,139 A | 9/1981 | Cobaugh et al. ............. | 339/74 |
| 4,371,912 A | 2/1983 | Guzik ........................ | 361/417 |
| 4,383,724 A | 5/1983 | Verhoevan .................. | 439/510 |
| 4,402,563 A | 9/1983 | Sinclair ....................... | 339/75 |
| 4,505,529 A | 3/1985 | Barkus ........................ | 439/82 |
| 4,536,955 A | 8/1985 | Gudgeon ..................... | 29/840 |
| 4,545,610 A | 10/1985 | Lakritz et al. ................ | 29/589 |
| 4,560,222 A | 12/1985 | Dambach ..................... | 339/75 |
| 4,596,433 A * | 6/1986 | Oesterheld et al. ......... | 439/206 |
| 4,717,360 A | 1/1988 | Czaja .......................... | 439/710 |
| 4,767,344 A | 8/1988 | Noschese ..................... | 439/83 |
| 4,776,803 A | 10/1988 | Pretchel et al. ............... | 439/59 |

(Continued)

FOREIGN PATENT DOCUMENTS

EP 0 273 683 A2 7/1988

(Continued)

OTHER PUBLICATIONS

Finan, J.M., "Thermally Conductive Thermoplastics", LNP Engineering Plastics, Inc., Plastics Engineering 2000, www.4spe.org, 4 pages.

(Continued)

*Primary Examiner*—Tho D. Ta
*Assistant Examiner*—Travis Chambers
(74) *Attorney, Agent, or Firm*—Woodcock Washburn LLP

(57) ABSTRACT

A preferred embodiment of an electrical connector includes a housing having a body. The body defines a contact-receiving aperture extending therethrough, and a heat-transfer aperture extending therethrough in substantially the same direction as the contact-receiving aperture for facilitating circulation of air through the body.

11 Claims, 5 Drawing Sheets

U.S. PATENT DOCUMENTS

| | | | |
|---|---|---|---|
| 4,815,987 A | 3/1989 | Kawano et al. | 439/263 |
| 4,867,713 A | 9/1989 | Ozu et al. | 439/833 |
| 4,878,611 A | 11/1989 | LoVasco et al. | 228/180.2 |
| 4,900,271 A | 2/1990 | Colleran et al. | 439/595 |
| 4,907,990 A | 3/1990 | Bertho et al. | 439/851 |
| 4,973,271 A | 11/1990 | Ishizuka et al. | 439/839 |
| 5,077,893 A | 1/1992 | Mosquera et al. | 29/882 |
| 5,174,770 A | 12/1992 | Sasaki et al. | 439/108 |
| 5,214,308 A | 5/1993 | Nishiguchi et al. | 257/692 |
| 5,238,414 A | 8/1993 | Yaegashi et al. | 439/108 |
| 5,254,012 A | 10/1993 | Wang | 439/263 |
| 5,274,918 A | 1/1994 | Reed | 29/882 |
| 5,302,135 A | 4/1994 | Lee | 439/263 |
| 5,381,314 A | 1/1995 | Rudy et al. | 361/712 |
| 5,400,949 A | 3/1995 | Hirvonen et al. | 228/180.22 |
| 5,431,578 A | 7/1995 | Wayne | 439/259 |
| 5,457,342 A | 10/1995 | Herbst, II | 257/712 |
| 5,475,922 A | 12/1995 | Tamura et al. | 29/881 |
| 5,490,040 A | 2/1996 | Gavdenzi et al. | 361/773 |
| 5,558,542 A | 9/1996 | O'Sullivan et al. | 439/682 |
| 5,590,463 A | 1/1997 | Feldman et al. | 29/844 |
| 5,609,502 A | 3/1997 | Thumma | 439/747 |
| 5,618,187 A | 4/1997 | Goto | 439/79 |
| 5,637,008 A | 6/1997 | Kozel | 439/342 |
| 5,691,041 A | 11/1997 | Frankeny et al. | 428/209 |
| 5,702,255 A | 12/1997 | Murphy et al. | 439/71 |
| 5,730,609 A | 3/1998 | Harwath | 439/108 |
| 5,741,144 A | 4/1998 | Elco et al. | 439/101 |
| 5,741,161 A | 4/1998 | Cahaly et al. | 439/709 |
| 5,742,484 A | 4/1998 | Gillette et al. | 361/789 |
| 5,743,009 A | 4/1998 | Matsui et al. | 29/843 |
| 5,745,349 A | 4/1998 | Lemke | 361/818 |
| 5,746,608 A | 5/1998 | Taylor | 439/70 |
| 5,755,595 A | 5/1998 | Davis et al. | 439/607 |
| 5,772,451 A * | 6/1998 | Dozier et al. | 439/70 |
| 5,787,971 A | 8/1998 | Dodson | 165/121 |
| 5,795,191 A | 8/1998 | Preputnick et al. | 439/608 |
| 5,810,607 A | 9/1998 | Shih et al. | 439/66 |
| 5,817,973 A | 10/1998 | Elco et al. | 174/32 |
| 5,874,776 A | 2/1999 | Kresge et al. | 257/747 |
| 5,876,219 A | 3/1999 | Taylor et al. | 439/74 |
| 5,883,782 A | 3/1999 | Thurston et al. | 364/704 |
| 5,888,884 A | 3/1999 | Wojnarowski | 438/462 |
| 5,908,333 A | 6/1999 | Perino et al. | 439/631 |
| 5,919,050 A | 7/1999 | Kehley et al. | 439/71 |
| 5,930,114 A | 7/1999 | Kuzmin et al. | 361/704 |
| 5,955,888 A | 9/1999 | Frederickson et al. | 324/761 |
| 5,961,355 A | 10/1999 | Morlion et al. | 439/686 |
| 5,971,817 A | 10/1999 | Longueville | 439/857 |
| 5,975,921 A | 11/1999 | Shuey | 439/83 |
| 5,980,270 A * | 11/1999 | Fjelstad et al. | 439/71 |
| 5,980,321 A | 11/1999 | Cohen et al. | 439/608 |
| 5,984,726 A | 11/1999 | Wu | 439/607 |
| 5,993,259 A | 11/1999 | Stokoe et al. | 439/608 |
| 6,012,948 A | 1/2000 | Wu | 439/567 |
| 6,050,862 A | 4/2000 | Ishii | 439/843 |
| 6,059,170 A | 5/2000 | Jimarez et al. | 228/119 |
| 6,068,520 A | 5/2000 | Winings et al. | 439/676 |
| 6,089,878 A | 7/2000 | Meng | 439/79 |
| 6,095,827 A | 8/2000 | Dutkowsky et al. | 439/83 |
| 6,123,554 A | 9/2000 | Ortega et al. | 439/74 |
| 6,125,535 A | 10/2000 | Chiou et al. | 29/883 |
| 6,139,336 A | 10/2000 | Olson | 439/83 |
| 6,146,157 A | 11/2000 | Lenoir et al. | 439/101 |
| 6,146,203 A | 11/2000 | Elco et al. | 439/608 |
| 6,152,756 A | 11/2000 | Huang et al. | 439/342 |
| 6,174,198 B1 | 1/2001 | Wu et al. | 439/541.5 |
| 6,180,891 B1 | 1/2001 | Murdeshwar | 174/260 |
| 6,183,301 B1 | 2/2001 | Paagman | 439/608 |
| 6,190,213 B1 | 2/2001 | Reichart et al. | 439/736 |
| 6,196,871 B1 | 3/2001 | Szu | 439/571 |
| 6,202,916 B1 | 3/2001 | Updike et al. | 228/180 |
| 6,210,197 B1 | 4/2001 | Yu | 439/342 |
| 6,212,755 B1 | 4/2001 | Shimada et al. | 29/527.1 |
| 6,215,180 B1 | 4/2001 | Chen et al. | 257/720 |
| 6,219,913 B1 | 4/2001 | Uchiyama | 29/883 |
| 6,220,884 B1 | 4/2001 | Lin | 439/342 |
| 6,220,895 B1 | 4/2001 | Lin | 439/607 |
| 6,220,896 B1 | 4/2001 | Bertoncici et al. | 439/608 |
| 6,257,478 B1 | 7/2001 | Straub | 228/6.2 |
| 6,259,039 B1 | 7/2001 | Chroneos, Jr. et al. | 174/263 |
| 6,269,539 B1 | 8/2001 | Takahashi et al. | 29/883 |
| 6,293,827 B1 | 9/2001 | Stokoe et al. | 439/608 |
| 6,309,245 B1 | 10/2001 | Sweeney | 439/507 |
| 6,319,075 B1 | 11/2001 | Clark et al. | 439/825 |
| 6,328,602 B1 | 12/2001 | Yamasaki et al. | 439/608 |
| 6,347,952 B1 | 2/2002 | Hasegawa et al. | 439/608 |
| 6,350,134 B1 | 2/2002 | Fogg et al. | 439/79 |
| 6,359,783 B1 | 3/2002 | Noble | 361/704 |
| 6,360,940 B1 | 3/2002 | Bolde et al. | 228/264 |
| 6,362,961 B1 | 3/2002 | Chiou | 361/704 |
| 6,363,607 B1 | 4/2002 | Chen et al. | 29/883 |
| 6,371,773 B1 | 4/2002 | Crofoot et al. | 439/79 |
| 6,379,188 B1 | 4/2002 | Cohen et al. | 439/608 |
| 6,409,543 B1 | 6/2002 | Astbury, Jr. et al. | 439/608 |
| 6,428,328 B2 * | 8/2002 | Haba et al. | 439/70 |
| 6,431,914 B1 | 8/2002 | Billman | 439/608 |
| 6,435,914 B1 | 8/2002 | Billman | 439/608 |
| 6,461,202 B2 | 10/2002 | Kline | 439/701 |
| 6,471,548 B2 | 10/2002 | Bertoncini et al. | 439/608 |
| 6,472,474 B2 | 10/2002 | Burkhardt et al. | 438/613 |
| 6,506,081 B2 | 1/2003 | Blanchfield et al. | 439/682 |
| 6,537,111 B2 | 3/2003 | Brammer et al. | 439/857 |
| 6,544,046 B1 | 4/2003 | Hahn et al. | 439/83 |
| 6,551,112 B1 | 4/2003 | Li et al. | 439/66 |
| 6,554,647 B1 | 4/2003 | Cohen et al. | 439/607 |
| 6,572,410 B1 | 6/2003 | Volstorf et al. | 439/608 |
| 6,652,318 B1 | 11/2003 | Winings et al. | 439/608 |
| 6,663,426 B2 | 12/2003 | Hasircoglu et al. | 439/608 |
| 6,665,189 B1 | 12/2003 | Lebo | 361/730 |
| 6,672,907 B2 | 1/2004 | Azuma | 439/682 |
| 6,692,272 B2 | 2/2004 | Lemke et al. | 439/108 |
| 6,702,594 B2 | 3/2004 | Lee et al. | 439/83 |
| 6,712,621 B2 | 3/2004 | Li et al. | 439/65 |
| 6,740,820 B2 | 5/2004 | Cheng | 174/260 |
| 6,743,037 B2 | 6/2004 | Kassa et al. | 439/342 |
| 6,746,278 B2 | 6/2004 | Nelson et al. | 439/608 |
| 6,829,143 B2 | 12/2004 | Russell et al. | 361/704 |
| 6,890,221 B2 | 5/2005 | Wagner | 439/855 |
| 6,947,012 B2 | 9/2005 | Aisenbrey | 343/906 |
| 6,975,511 B1 | 12/2005 | Lebo et al. | 361/703 |
| 7,182,642 B2 | 2/2007 | Ngo et al. | 439/608 |
| 2001/0003685 A1 | 6/2001 | Aritani | 439/485 |
| 2002/0142676 A1 | 10/2002 | Hosaka et al. | 439/874 |
| 2002/0159235 A1 | 10/2002 | Miller et al. | 361/704 |
| 2003/0013330 A1 | 1/2003 | Takeuchi | 439/83 |
| 2003/0143894 A1 | 7/2003 | Kline et al. | 439/608 |
| 2003/0220021 A1 | 11/2003 | Whiteman, Jr. et al. | 439/608 |
| 2004/0183094 A1 | 9/2004 | Caletka et al. | 257/178 |
| 2006/0003620 A1 | 1/2006 | Daily et al. | 439/295 |

FOREIGN PATENT DOCUMENTS

| | | |
|---|---|---|
| EP | 0 789 422 A2 | 8/1997 |
| JP | 06-236788 | 8/1994 |
| JP | 07-114958 | 5/1995 |
| JP | 0 812 5379 | 5/1996 |
| JP | 2000-003743 | 1/2000 |
| JP | 2000-003744 | 1/2000 |
| JP | 2000-003745 | 1/2000 |
| JP | 2000-003746 | 1/2000 |
| TW | 546 872 | 8/2003 |
| TW | 576 555 | 2/2004 |
| WO | WO 97/43885 | 11/1997 |

| WO | WO 97/44859 | 11/1997 |
| WO | WO 98/15989 | 4/1998 |
| WO | WO 01/29931 A1 | 4/2001 |
| WO | WO 01/39332 A1 | 5/2001 |

OTHER PUBLICATIONS

Sherman, L.M., "Plastics that Conduct Heat", Plastics Technology Online, Jun. 2001, http:www.plasticstechnology.com, 4 pages.

Ogando, J., "And now-An Injection-Molded Heat Exchanger", Sure, plastics are thermal insulators, but additive packages allow them to conduct heat instead, Global Design News, Nov. 1, 2000, 4 pages.

In the United States Patent and Trademark Office, Office Action Summary-Final Rejection of Application No:. 11/255,295, Dated Oct. 11, 2007, 10 pages.

In the United States Patent and Trademark Office, Office Action Summary of Application No:. 11/255,295, Dated Apr. 25, 2007, 11 pages.

In the United States Patent and Trademark Office, Office Action Summary of Application No:. 11/255,295, Dated Dec. 21, 2006, 16 pages.

* cited by examiner

SURFACE-MOUNT CONNECTOR

This application claims priority under 35 U.S.C. § 119(e) to U.S. provisional application No. 60/648,561, filed Jan. 31, 2005, the contents of which is incorporated by reference herein in its entirety. This application is related to U.S. application number 11/255,296 entitled "Electrical Power Connector," filed Oct. 20, 2005, which claims priority under 35 U.S.C. § 119(e) to U.S. provisional application no. 60/638,470, filed Dec. 22, 2004; and U.S. provisional application no. 60/668,350, filed Apr. 5, 2005. The contents of each of these applications is incorporated by reference herein in its entirety.

FIELD OF THE INVENTION

The present invention relates generally to electrical connectors. More specifically, the invention relates to a surface-mount connector, such as a ball-grid array connector ("BGA connector"), having features that permit air to circulate through the connector.

BACKGROUND OF THE INVENTION

Surface-mount connectors such as BGA connectors typically include a plurality of electrically-conductive contacts mounted in a housing. Each conductor has a solder ball attached to a tail portion thereof. The solder balls collectively form a ball grid array.

The solder balls are used to form electrical and mechanical connections between the connector and a substrate, such as a printed-circuit board (PCB), on which the connector is mounted. The connector is mounted on the substrate by heating the solder balls to their melting point. The melted solder subsequently cools and re-hardens to form solder connections between the connector and the substrate.

The solder balls can be heated by placing the connector and the substrate in a convection reflow oven. The oven directs heated air over the connector. Heat is transferred to the solder balls directly and indirectly, by a combination of conductive and convective heat transfer.

The rate of heat transfer to the individual solder balls usually is not uniform throughout the ball grid array. In particular, the heated air primarily contacts the outermost surfaces the connector, and the outermost solder balls in the ball-grid array, i.e., the solder balls located proximate to the outer perimeter of the ball-grid array. The outermost solder balls therefore tend to receive a higher amount of thermal energy than the innermost, i.e., centrally-located, solder balls.

The need to transfer sufficient thermal energy to the innermost portion of the connector to melt the centrally-located solder balls can be addressed by slowing the speed of the connector and the substrate through the convection reflow oven, i.e., by increasing the dwell time of the connector and the substrate in the oven. This approach can lower the yield of the oven, i.e., number of connector and substrate pairs that can be processed in the oven per unit time.

Alternatively, the temperature of the heated air within the convection reflow oven can be increased. This approach, however, can result in unintended connector, substrate, or component damage.

SUMMARY OF THE INVENTION

To help solve uneven heating of surface-mount connectors having fusible elements such as solder balls, the present invention includes an electrical connector that has heat-transfer passages, and other passages fluidly connected to the heat-transfer passages. In general, one aspect of the present invention is to expose more of the center portion of the connector to: (i) heated air during reflow; and (ii) ambient airflow to help cool the connector in operation.

A preferred embodiment of an electrical connector comprises a housing including a body. The body defines a contact-receiving aperture extending therethrough, and a heat-transfer aperture extending therethrough in substantially the same direction as the contact-receiving aperture for facilitating circulation of air through the body.

A preferred embodiment of an electrical connector for mounting on a substrate comprises a plurality of insert molded leadframe assemblies each comprising a frame, and a plurality of electrically-conductive contacts mounted on the frame. The connector also comprises a housing having a body including a first face that faces the substrate when the connector is mounted thereon, and a second face. The body has a first plurality of apertures formed therein and extending between the first and second faces for receiving the contacts, and a second plurality of apertures formed therein and extending between the first and second faces.

The insert-molded leadframe assemblies are secured to the housing so that the first face of the housing and adjacent ones of the insert-molded leadframe assemblies define passages that adjoin the second plurality of apertures.

Another preferred embodiment of an electrical connector comprises a first and a second linear array of electrically-conductive contacts, a plurality of fusible elements each attached to a respective one of the contacts, and a housing having a body. The body has a first and a second linear array of apertures formed therein for receiving the respective first and second liner arrays of contacts, and a third linear array of apertures positioned between the first and second linear arrays of apertures for permitting air to flow through the body.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF ILLUSTRATIVE EMBODIMENTS

Figure 3:
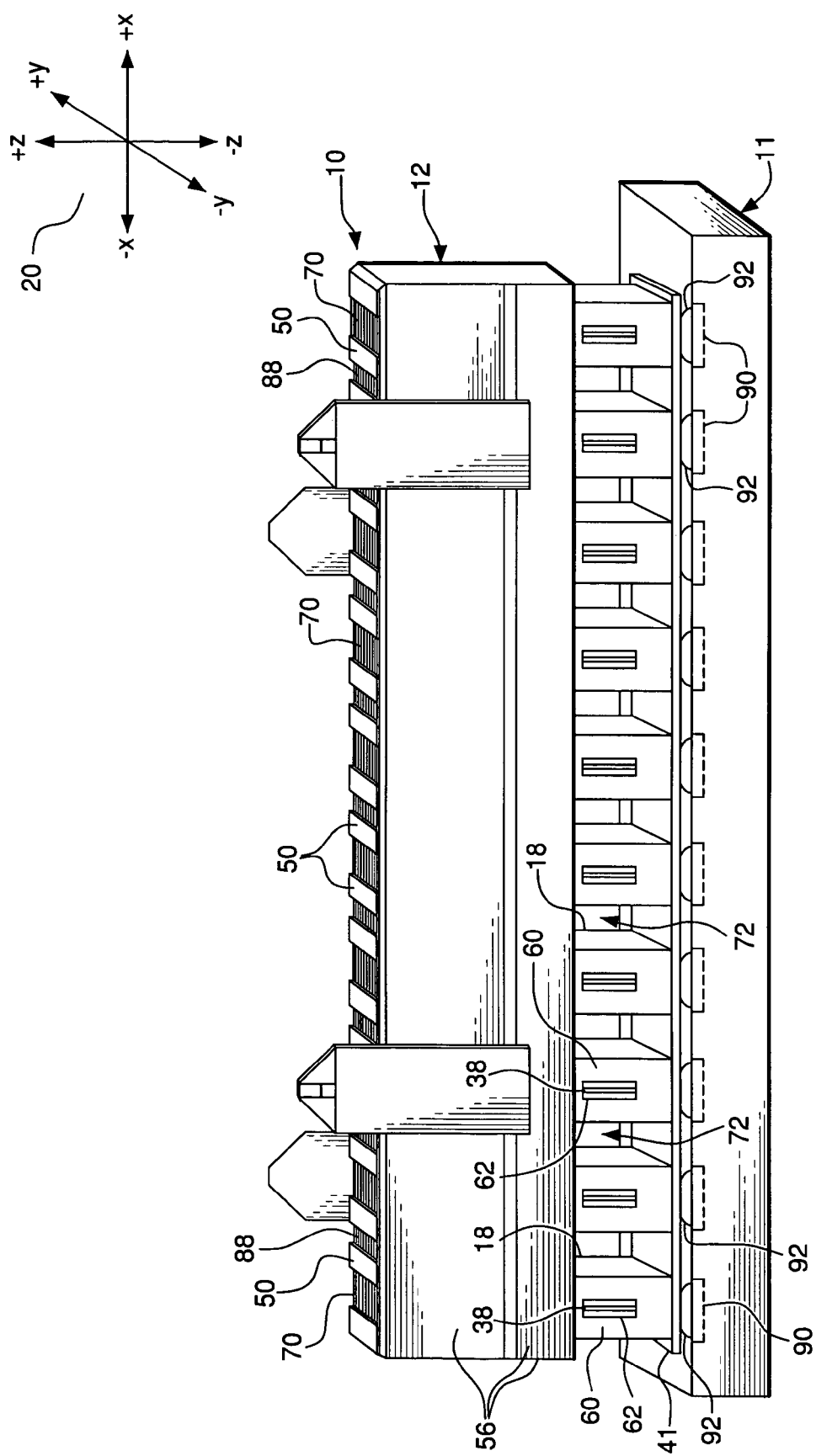
FIG. 3 is a side view of the BGA-type connector shown in FIGS. 1 and 2, depicting the connector mounted on a substrate.

The figures depict a preferred embodiment of a BGA-type connector 10. The figures are each referenced to a common coordinate system 20 depicted therein. The connector 10 can be mounted on a substrate 11, as shown in FIG. 3. The connector 10 comprises a housing 12, and a plurality of insert-molded leadframe assemblies (IMLAs) 14 mechanically coupled to the housing 10.

Figure 5:
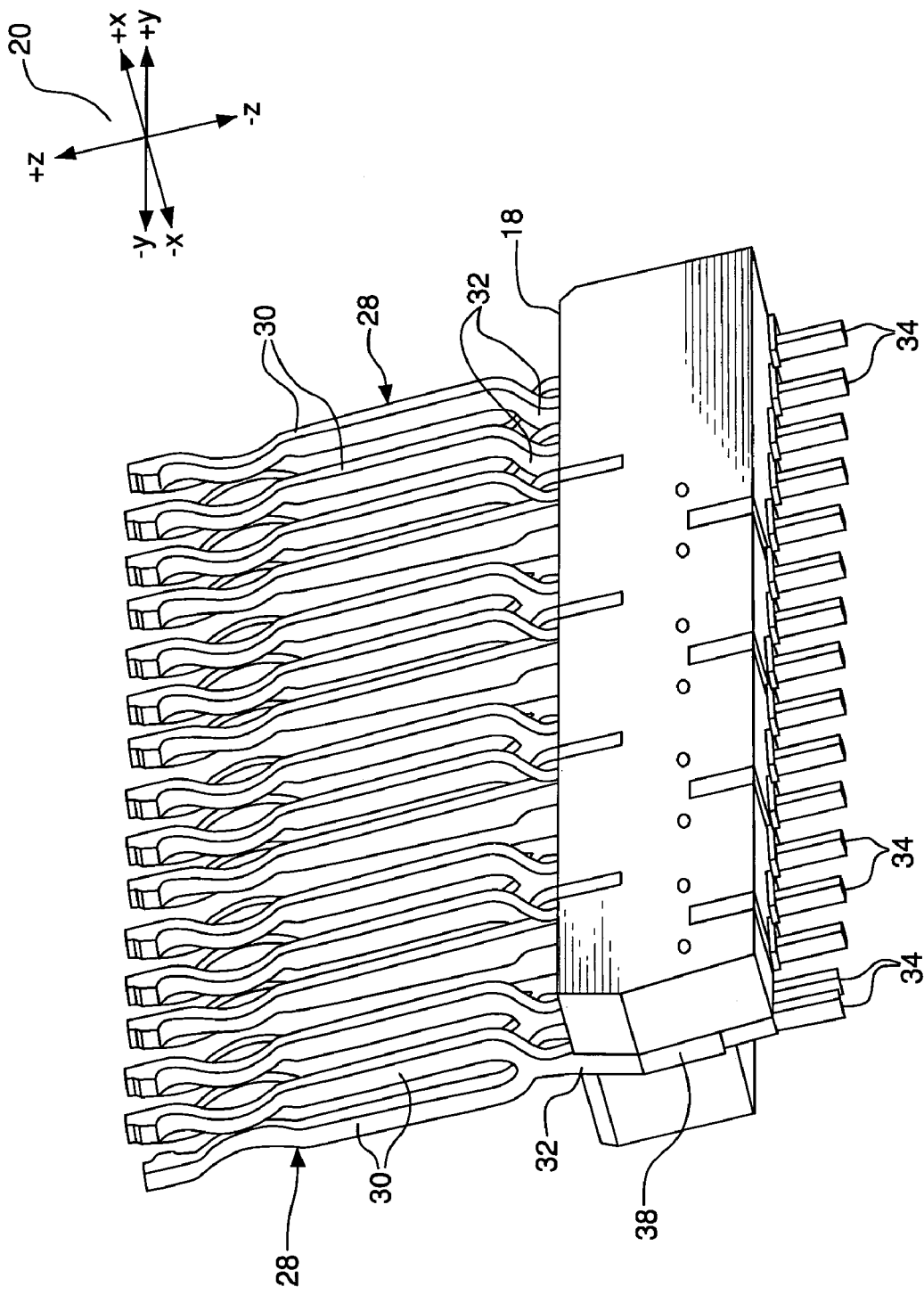
FIG. 5 is a perspective view of an insert-molded leadframe assembly of the BGA-type connector shown in FIGS. 1-4.

Each IMLA 14 includes electrically-conductive contacts 16. Each IMLA 14 also includes an overmolded frame 18 for holding the contacts 16, so that the contacts 16 of each IMLA 14 form a linear array. The frame 18, which is best shown in FIG. 5, is formed from a suitable electrically-insulative material such as plastic. The connector 10, in turn, carries the IMLAs 14. Any number of the IMLAs 14 or the electrical contacts 16 can be used, depending on the desired contact density.

Each contact 16 includes a mating portion 28, as shown in FIG. 5. The contacts 16 can be, for example, flexible dual beam mating contacts in which the mating portion 28 comprises two contact beams 30. The contact beams 30 of each contact 16 can receive a complementary contact beam (not shown) of another connector or electrical device when the connector 10 is mated therewith.

Each contact 16 also includes a middle portion 32 that adjoins the mating portion 28, and a tail portion 34 that adjoins the middle portion 32. The frame 18 of each IMLA 14 is molded around the middle portion 32, or some other suitable portion of the corresponding contact 16. The contacts 16 located at the opposing ends of each IMLA 14 can each include a tab 38, the purpose of which is discussed below.

Other configurations for the contacts 16 are possible in alternative embodiments. For example, a contact having a tail portion comprising two spring beams can be used in the alternative. This type of contact is described in pending U.S. patent application Ser. No. 11/022,137, filed Dec. 23, 2004, the contents of which is incorporated by reference herein in its entirety.

Figure 4:
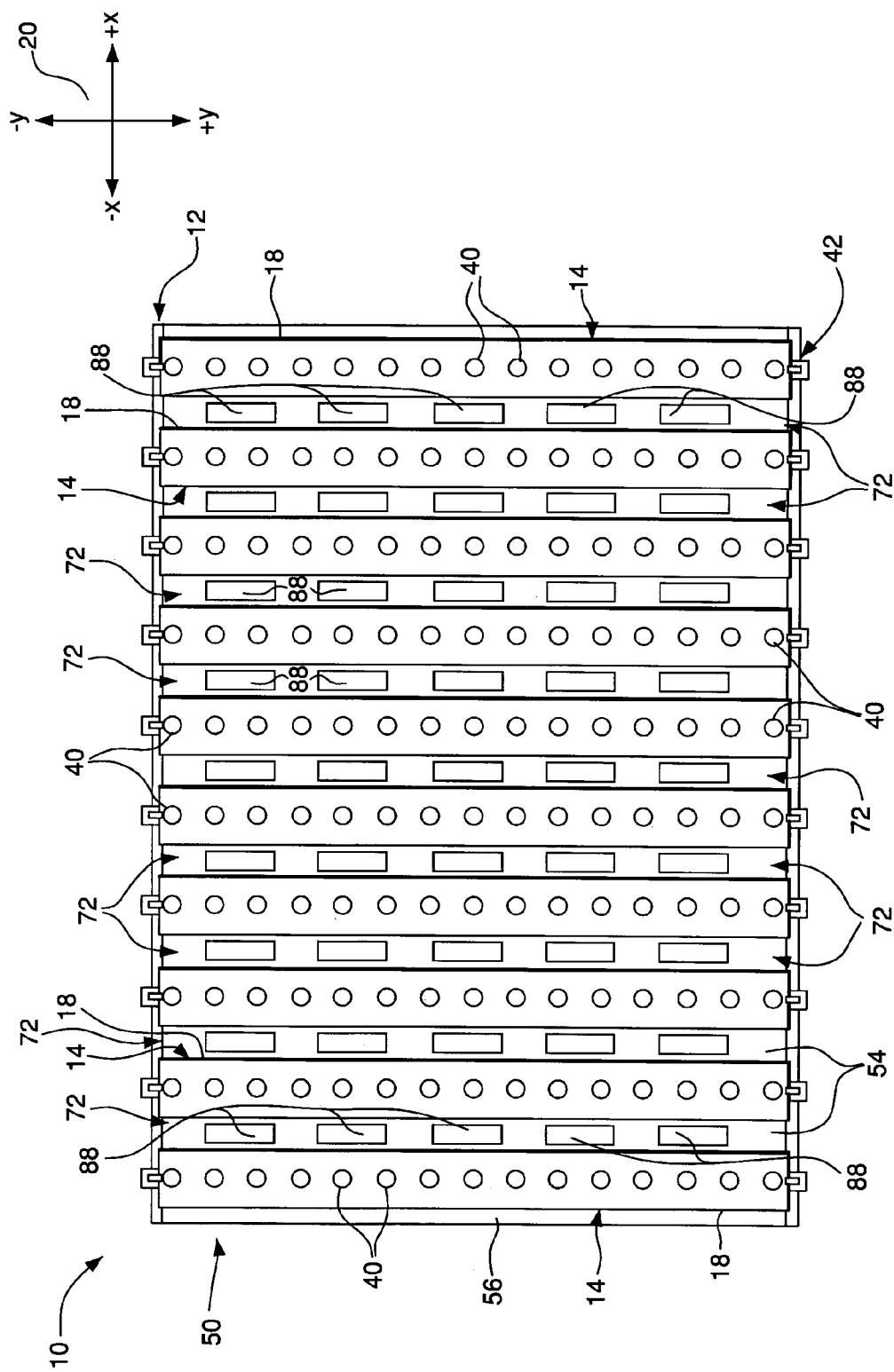
FIG. 4 is a bottom view of the BGA-type connector shown in FIGS. 1-3, with a wafer of the connector not shown.

The connector 10 preferably includes a plurality of fusible elements in the form of solder balls 40, and a wafer 41. Each solder ball 40 is attached to the tail portion 34 of a corresponding one of the contacts 16. The solder balls 40 collectively form a ball-grid array 42 below the connector 10, as shown in FIG. 4.

Figure 2:
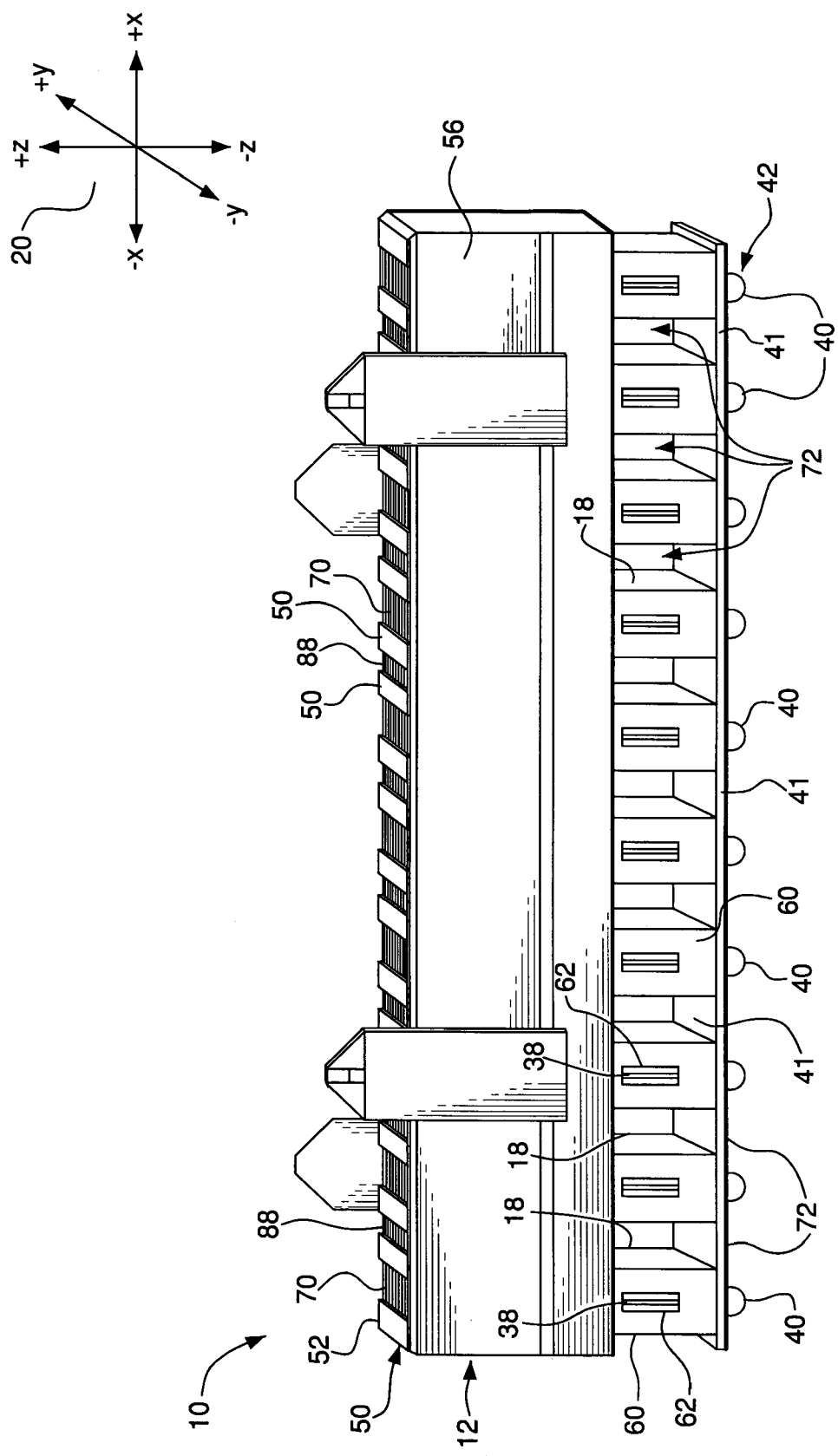
FIG. 2 is a side view of the BGA-type connector shown in FIG. 1.

The wafer 41 is positioned between the ball grid array 42 and the frames 18 of the IMLAs 14, as shown in FIGS. 2 and 3. The wafer 41 has a plurality of apertures and optional pockets formed therein. Each aperture is associated with one of the optional pockets. The tail portion 34 of each contact 16 extends through the wafer 41 by way of an associated one of the apertures. When used, each pocket receives a portion of an associated one of the solder balls 40 during a first reflow operation. The pockets help to locate the solder balls 40 with respect to the tail portions 34 of the contacts 16. The solder balls 40, as discussed below, are melted during a second reflow operation to form solder connections 92 between the connector 10 and the substrate 11 when the connector 10 is mounted on the substrate 11.

Directional terms such as "above," "below," "upper," "lower," etc. are used with reference to the component orientations depicted in FIGS. 2 and 3. These terms are used for exemplary purposes only, and unless otherwise noted, are not meant to limit the scope of the appended claims.

Figure 1:
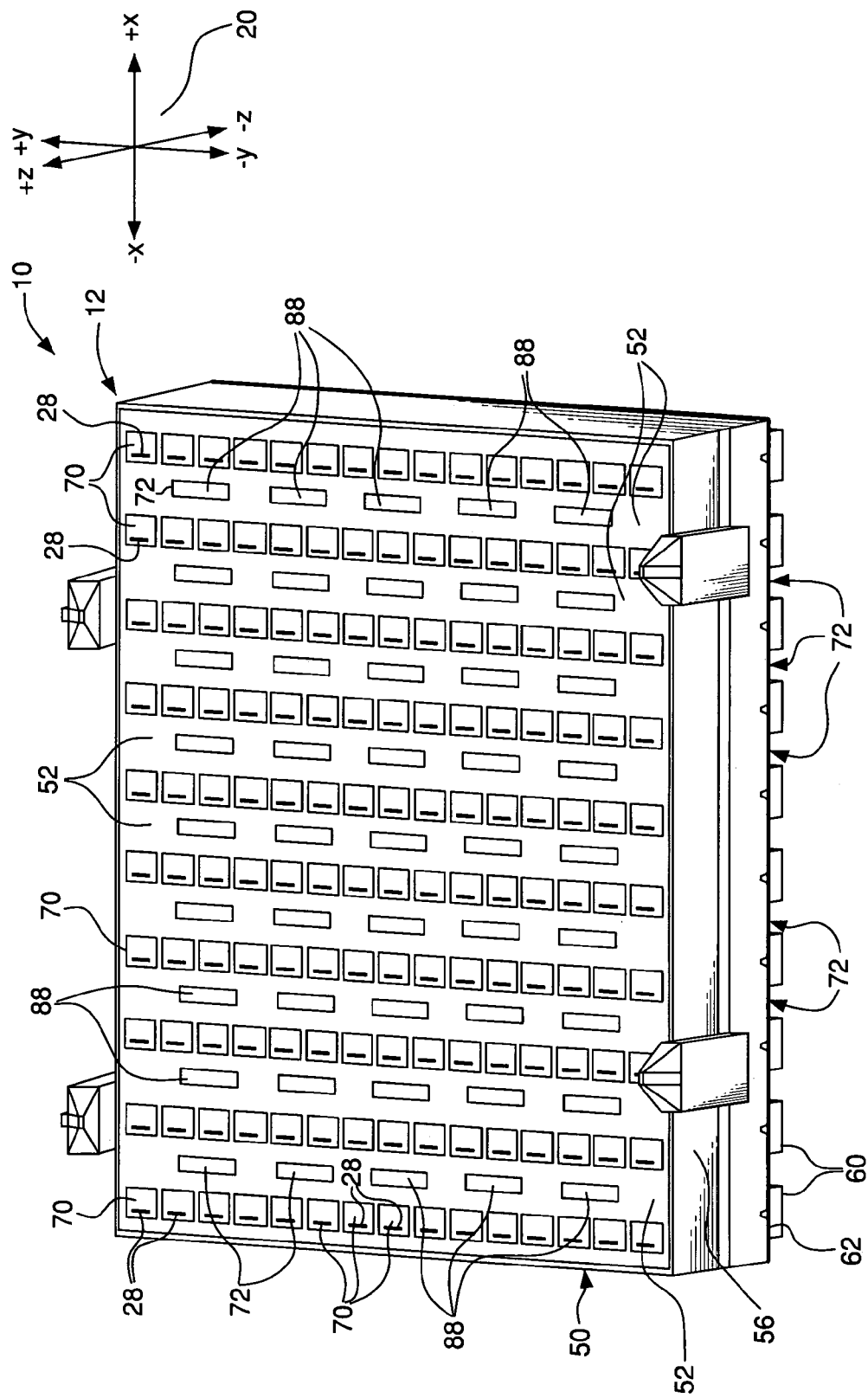
FIG. 1 is a top perspective view of a preferred embodiment of a BGA-type surface-mount connector.

The housing 12 includes a body 50. The body 50 has an upper surface, or mating face 52, and a lower surface, or mounting face 54. The mating face 52 and the mounting face 54 are best shown in FIGS. 1 and 4, respectively. The body 50 also includes side portions 56 that adjoin the respective outer edges of the mating face 52 and mounting face 54.

The body 50 has a plurality of contact-receiving apertures 70 formed therein, as best shown in FIG. 1. The contact-receiving apertures 70 extend between the mating face 52 and the mounting face 54. Each of the contact-receiving apertures 70 receives the mating portion 28 of a corresponding one of the contacts 16. The contact-receiving apertures 70 are arranged to match the linear arrays of the contacts 16 formed by each IMLA 14.

The housing 12 also includes a plurality of retaining legs 60, as best shown in FIGS. 1-3. The retaining legs 60 extend downward from an opposing two of the side portions 56. Each retaining leg 60 has a slot 62 formed therein.

Opposing pairs of the retaining legs 60 retain a corresponding one of the IMLAs 14. In particular, the slots 62 in the retaining legs 60 each receive a corresponding one of the tabs 38 on the outermost end contacts 16 of each IMLA 14. The tabs 38 and the slots 62 are sized so that the each tab 38 fits snugly within the corresponding slot 62, thereby securing the outermost contacts 16, and the rest of the corresponding IMLA 14, to the housing 12.

Adjacent ones of the retaining legs 60 are spaced apart, as best shown in FIGS. 2-4. The frame 18 of each IMLA 14 has a width, or "x" dimension, approximately equal to the width, or "x" dimension, of the retaining legs 60. The noted spacing of the retaining legs 60 thus causes the frames 18 of adjacent ones of the IMLAs 14 to be spaced apart by a corresponding amount. The spacing arrangement results in voids, or passages 72 between adjacent ones of the frames 18. Each passage 72 is defined by adjacent ones of the frames 68, and the adjacent portion of the mounting face 54. The passages 72 extend in substantially the same direction as the frames 18, i.e., the passages 72 extend substantially in the "y" direction.

The passages 72, as discussed in detail below, can facilitate air circulation that helps to heat the solder balls 40 as the solder balls 40 are melted to form the solder connections 92 between the connector 10 and the substrate 11. The width, or "x" dimension, of each passage 72 therefore should be sufficient to facilitate airflow therethrough. In the connector 10, the width of each passage 72 is approximately half the respective widths of the retaining legs 60 and the frames 18. It should be noted that this particular dimensional relationship is described for exemplary purposes only. Other dimensional relationships can be used in the alternative. For example, the width of the passages 72 can be increased or decreased, depending on the desired contact density.

The body 50 has a plurality of heat-transfer apertures 88 formed therein, as best shown in FIGS. 1 and 4. The heat-transfer apertures 88 extend between the mating face 52 and the mounting face 54. The heat-transfer apertures 88, as discussed in detail below, can facilitate air circulation that helps to heat the solder balls 40 as the solder balls 40 are melted to form the solder connections 92 between the connector 10 and the substrate 11.

A row of the heat-transfer apertures 88 is preferably formed between each adjacent row of the contact-receiving apertures 70. The bottom of each heat-transfer aperture 88 fluidly connects to a corresponding one of the passages 72. Any number of heat-transfer apertures 88 can be disposed in each row thereof, although rows of five or more of the heat-transfer apertures 88 are preferred. The heat-transfer apertures 70 preferably are rectangular, although other shapes can be used in the alternative.

The solder balls 40, as noted above, are melted in a reflow operation to form solder connections 92 between the connector 10 and the substrate 11 when the connector 10 is mounted on the substrate 11. In particular, the connector 10 preferably is placed on the substrate 11 so that each solder ball 40 substantially aligns with a corresponding electrically-conductive contact pad 90 on the substrate 11. The connector 10 and the substrate 11 are then heated by a thermally-excited medium, such as heated air.

The heating of the solder balls 40 eventually causes the solder balls 40 to melt and form solder connections 92 between each corresponding pair of contacts 16 and solder pads 90. The solder connections 92 are depicted diagrammatically in FIG. 3.

The liquid solder from the solder balls 40 is allowed to cool after the connector 10 and the substrate 11 exit the oven. The liquid solder, upon cooling, solidifies into the solder connections 92. The solder connections 92 electrically and mechanically couple the connector 10 to the contacts pads 90 of the substrate 11.

The heat-transfer apertures 88 and the passages 72 increase the rate of heat transfer to the solder balls 40. In particular, the heat-transfer apertures 88 adjoin the passages 72, as noted above. Therefore, the heat transfer apertures 88 and the passages 72 provide a fluid path for heated air flowing over the connector 10.

Once entering the passages 72, some of the heated air can reach the solder balls 40 by way of additional apertures formed in the wafer 41, such as between columns or rows of contact/solder ball ends, thereby increasing the heat-transfer rate to the solder balls 40. Moreover, convective heat transfer can occur to the structure of the connector 10 that defines the passages 72. For example, the heated air can warm the frames 18 of the IMLAs 14. Conductive heat transfer from the frames 18 to the associated contacts 16 and solder balls 40 can further warm the solder balls 40.

The heat-transfer apertures 88 and the passages 72 can thus increase the rate of heat transfer to the solder balls 40, and in particular to the innermost, i.e., centrally-located, solder balls 40 in the ball-grid array 42. The heat-transfer apertures 88 and the passages 72 can thereby help to substantially reduce or eliminate the disparity in the temperature of the outermost and innermost of the contacts 16 that could otherwise occur during the reflow process.

The heat-transfer apertures 88 and the passages 72 therefore can potentially eliminate the need to subject the connector 10 and the substrate 11 to excessive temperatures or relatively lengthy dwell times in the solder reflow oven to ensure adequate heating of the innermost solder balls 40. In addition, the heat-transfer apertures 88 and the passages 72 can potentially enhance the uniformity, integrity, and reliability of the solder connections 92. In addition, the heat flow may also make it easier to remove a connector that is already soldered to a substrate. An attached connector has less clearance between the bottom of the connector and the surface of the substrate. This makes heating solder connections at an interior point on the BGA pattern more difficult. The present invention helps to alleviate this problem.

The heat-transfer apertures 88 and the passages 72 can be used in connection with other techniques to affect the heating of the solder balls 40. For example, the connector 10, and alternative embodiments thereof, can be equipped with a cap such as the cap disclosed in pending U.S. patent application Ser. No. 10/340,279, filed Jan. 10, 2003, the contents of which is incorporated by reference herein in its entirety, to retard the melting of the solder balls 40 by blocking the apertures 88 and the passageways 72.

Moreover, the heat-transfer apertures 88 and the passages 72 can facilitate circulation of ambient air through the connector 10 in operation, thereby helping to cool the connector 10.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example alternative embodiments of the connector 10 can be configured without the passages 72 or the heat-transfer apertures 88. In other words, alternative embodiments can include the passages 72 without the heat-transfer apertures 88. Other alternative embodiments can include the heat-transfer apertures 88 without the passages 72. Moreover, the principles of the invention can be applied to plug connectors, as well receptacle connectors. The principles of the invention can also be applied any type of object that is surface mounted, including but not limited to right-angle connectors.

What is claimed:

1. An electrical connector for mounting on a substrate, comprising:
    a plurality of insert molded leadframe assemblies each comprising a frame and a plurality of electrically-conductive contacts mounted on the frame;
    a housing having a body including a first face that faces the substrate when the connector is mounted thereon, and a second face, the body having a first plurality of apertures formed therein and extending between the first and second faces for receiving the contacts, and a second plurality of apertures formed therein and extending between the first and second faces, wherein the insert-molded leadframe assemblies are secured to the housing so that the first face of the housing and adjacent ones of the insert-molded leadframe assemblies define passages that adjoin the second plurality of apertures.

2. The electrical connector of claim 1, further comprising a plurality of retaining legs extending from opposing sides of the body for retaining the insert-molded leadframe assemblies.

3. The electrical connector of claim 1, wherein adjacent ones of the retaining legs are spaced apart so that ends of the passages are open.

4. The electrical connector of claim 1, wherein the second plurality of apertures extend substantially in a first direction, and the passages extend substantially in a second direction perpendicular to the first direction.

5. The electrical connector of claim 1, further comprising a plurality of solder balls attached to respective ones of the contacts for forming solder connections between the electrical connector and the substrate.

6. The electrical connector of claim 5, wherein the second plurality of apertures and the passages can facilitate circulation of heated air toward the fusible elements.

7. An electrical connector, comprising:
a first and a second insert-molded leadframe assembly, wherein the first leadframe assembly comprises a first frame, a first linear array of electrically-conductive contacts mounted on the first frame, and a first plurality of fusible elements each attached to a respective one of the first plurality of electrically-conductive contacts, and the second leadframe assembly comprises a second frame, a second linear array of electrically-conductive contacts mounted on the second frame, and a second plurality of fusible elements each attached to a respective one of the second plurality of electrically-conductive contacts;
and
a housing having a body, the body having a first and a second linear array of apertures formed therein for receiving the respective first and second liner arrays of contacts, and a third linear array of apertures positioned between the first and second linear arrays of apertures for permitting air to flow through the body.

8. The electrical connector of claim 7, wherein the third linear array of apertures extend between a mating face and a mounting face of the body.

9. The electrical connector of claim 7, wherein the first and second frames are secured to the housing so that the first and second frames and a surface of the housing define a passage that adjoins the third linear array of apertures.

10. The electrical connector of claim 9, wherein the housing comprises a plurality of retaining legs, the first and second frames are secured to respective ones of the retaining legs, and the retaining legs are spaced apart so that the first and second frames are spaced apart by a corresponding amount and ends of the passage are open.

11. The electrical connector of claim 9, wherein the third linear array of apertures and the passage form a path for air to circulate through the electrical connector.

* * * * *